(12) United States Patent
Sirton

(10) Patent No.: US 8,199,175 B2
(45) Date of Patent: Jun. 12, 2012

(54) METHODS AND APPARATUS FOR APPLYING PATTERNS OF NON-CONTIGUOUS FEATURES

(75) Inventor: Guy Sirton, Delta (CA)

(73) Assignee: Kodak Graphic Communications Canada Company, Burnaby (CA)

( * ) Notice: Subject to any disclaimer, the term of this patent is extended or adjusted under 35 U.S.C. 154(b) by 487 days.

(21) Appl. No.: 12/304,795

(22) PCT Filed: Jun. 18, 2007

(86) PCT No.: PCT/IB2007/001631
§ 371 (c)(1),
(2), (4) Date: Sep. 9, 2009

(87) PCT Pub. No.: WO2008/004048
PCT Pub. Date: Jan. 10, 2008

(65) Prior Publication Data
US 2010/0039490 A1 Feb. 18, 2010

Related U.S. Application Data

(60) Provisional application No. 60/806,452, filed on Jun. 30, 2006.

(51) Int. Cl.
*B41J 2/325* (2006.01)
*B41J 2/435* (2006.01)

(52) U.S. Cl. ........ 347/171; 347/172; 347/224; 347/225; 347/233

(58) Field of Classification Search .................. 347/224, 347/225, 233, 171, 172
See application file for complete search history.

(56) References Cited

U.S. PATENT DOCUMENTS

| 5,724,086 A | * | 3/1998 | Mackin et al. | 347/237 |
| 5,808,655 A | * | 9/1998 | Haas et al. | 347/234 |
| 2009/0309954 A1 | * | 12/2009 | Sirton et al. | 347/248 |
| 2010/0188472 A1 | * | 7/2010 | Sirton et al. | 347/233 |

* cited by examiner

*Primary Examiner* — Huan Tran
(74) *Attorney, Agent, or Firm* — Nelson Adrian Blish

(57) ABSTRACT

A pattern of non-contiguous features that can be imaged in one pass of a multi-channel imaging head is divided into sets of the non-contiguous features. Each set of the non-contiguous features is imaged separately during a single scan of the multi-channel imaging head. The pattern can be completely imaged after all of the sets have been separately imaged. The non-contiguous features of one set may be interleaved with the non-contiguous features of another one of the sets.

8 Claims, 8 Drawing Sheets

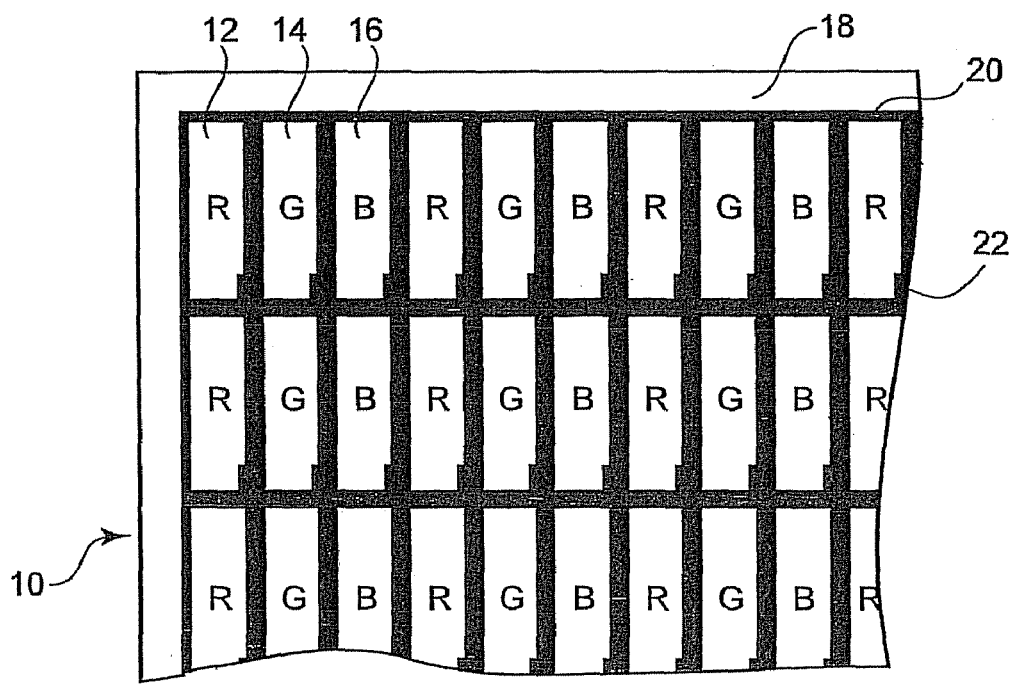
FIG. 1-A
PRIOR ART
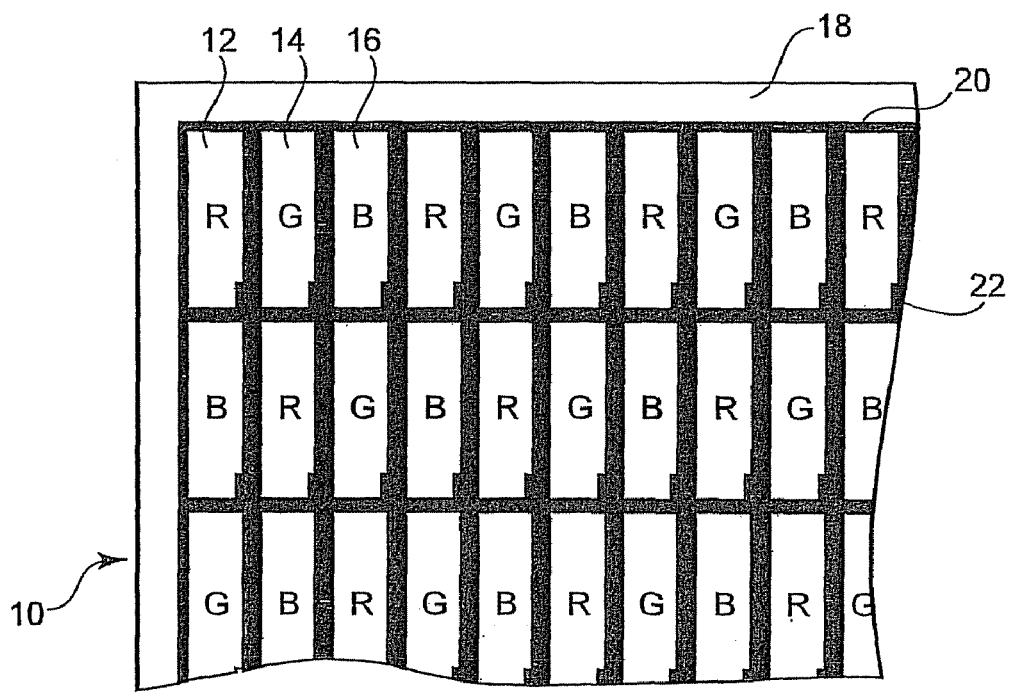
FIG. 1-B
PRIOR ART

METHODS AND APPARATUS FOR APPLYING PATTERNS OF NON-CONTIGUOUS FEATURES

RELATED APPLICATIONS

This application claims priority to U.S. Provisional Application No. 60/806,452 entitled "METHODS AND APPARATUS FOR APPLYING PATTERNS OF NON-CONTIGUOUS FEATURES" filed Jun. 30, 2006.

TECHNICAL FIELD

The invention relates to imaging systems and methods. Embodiments of the invention provide methods and apparatus for imaging patterns of non-contiguous features. The invention may be applied to fabricating color filters for electronic displays, for example.

BACKGROUND OF THE INVENTION

Common techniques for fabricating displays and semiconductor electronic devices involve several imaging steps. Typically, in each step, a substrate coated with a resist or other sensitive material is exposed to radiation through a photo-tool mask to effect some change. Each step has a finite risk of failure. The possibility of failure at each step reduces the overall process yield and increases the cost of the finished article.

A specific example is the fabrication of color filters for flat panel displays such as liquid crystal displays. Color filter fabrication can be a very expensive process because of the high cost of materials and low process yield. Traditional photolithographic processing involves applying color resist materials to a substrate using a coating technique such as spin-coating, slit and spin or spin-less coating. The material is then exposed via a photo-tool mask and developed.

Thermal transfer processes have been proposed for use in the fabrication of displays and in particular color filters. In such processes, a color filter substrate also known as a receiver element, is overlaid with a donor element that is then image-wise exposed to selectively transfer a colorant from the donor element to the receiver element. Preferred methods of image-wise use laser beams to induce transfer of the colorant to the receiver element. Diode lasers are particularly preferred for their ease of modulation, low cost and small size.

Thermal transfer processes can include laser induced "thermal transfer" processes, laser-induced "dye transfer" processes, laser-induced "melt transfer" processes, laser-induced "ablation transfer" processes, and laser-induced "mass transfer" processes. Colorants transferred during thermal transfer process can include suitable dye or pigment based compositions. Additional elements such as one or more binders may be transferred, as is known in laser-induced mass transfer processes.

Direct imaging systems typically employ hundreds of individually modulated beams in parallel to reduce the time taken to complete images. Imaging heads with large numbers of such "channels" are readily available. For example, one model of SQUAREspot® thermal imaging head manufactured by Kodak Graphic Communications Canada Company, British Columbia, Canada has several hundred independent imaging channels, each channel having power in excess of 25 mW. The array of imaging channels can be controlled such that an image is written in a series of swaths which are closely abutted to form a continuous image.

One problem with multi-channel imaging systems is that it is extremely difficult to ensure that all channels have identical imaging characteristics. Different imaging characteristics among channels may result from differences in the output radiation that the channels project upon the imaged media. Variations in the output radiation emitted by the array of imaging channels may originate from channel-to-channel variations in power, beam size, beam shape and/or focus. These variations contribute to the production of a common imaging artifact known as banding. Banding is often particularly prominent in the area between two successively-imaged swaths. This is primarily because the end of the last imaged swath and the beginning of the next imaged swath are usually written by channels at opposite ends of a multi-channel array. As such, these channels are more likely to have differing imaging characteristics. A gradual increase in a spot characteristic from channel-to-channel may or may not be visible within the swath itself, but when a swath is abutted with another swath, a visible discontinuity at the swath boundary may result in a pronounced artifact in the image. Banding can be a function of any overlap or separation of successive swaths as well as channel variance within each of the respective swaths.

Various approaches have been used in an attempt to precisely position swaths next to one another. Precise control over the positions of imaged swaths is typically necessary but not sufficient to eliminate banding, especially when the imaging system changes over time in response to varying environmental factors. Banding artifacts may not be solely attributable to the imaging system. The imaged media itself may also contribute to banding, and other imaging artifacts.

U.S. Pat. Nos. 4,900,130; 5,164,742; 5,278,578; 5,808,655; 6,597,388; 6,765,604; and 6,900,826 disclose various methods to attempt to alleviate various artifact problems such as banding.

"Raster scan line" interleaving techniques have been proposed to reduce banding and other imaging artifacts. Examples of raster scan line interleaving techniques are disclosed in U.S. Pat. Nos. 5,691,759; 6,597,388; 6,784,912; and 6,037,962. Image artifacts including banding may be further aggravated when a pattern of non-contiguous features is imaged.

Image artifact complications can also arise when a thermal transfer process is employed in the imaging of a repeating pattern of non-contiguous features as typically required in the production of color filters. Color filters typically consist of a repeating pattern of color elements, each of the elements corresponding to one of the colors required by the color filter. Each of the color elements is typically smaller in width than the width of the overall swath that can be imaged with a multi-channel imaging head. Various image artifacts including banding can result when varying color transfer efficiency causes differences between the color elements, as well as within the elements themselves. Since the lines form a repeating pattern, a visual beating readily perceptible by the human eye results which typically reduces the quality of the color filter.

There remains a need for imaging methods that lessen the visibility of banding and other imaging artifacts associated with the imaging of patterns of non-contiguous features. There remains a need for imaging methods that lessen the visibility of banding and other imaging artifacts associated with the imaging of repeating patterns of non-contiguous features such as the patterns of color elements in color filters.

SUMMARY OF THE INVENTION

A method for imaging patterns of non-contiguous features comprises: operating a multi-channel imaging head during a first scan of the imaging head in which the imaging head is advanced relative to the receiver element to transfer first and second non-contiguous features from a donor element to the receiver element by a thermal transfer process and subsequently operating the multi-channel imaging head during a second scan of the imaging head in which the imaging head is operated to transfer a third non-contiguous feature from the donor element to the receiver element by the thermal transfer process. The first and second features are spatially separated from one another other at least in a sub-scan direction. The third feature is between the first and second features and is spatially separated from each of the first and second features at least in the sub-scan direction. In the first and second scans, the imaging head may be moved relative to the receiver element in the same direction relative to the receiver element or in opposing directions.

Another aspect of the invention provides a method for forming a plurality of non-contiguous features on a receiver element. The method comprises sequentially transferring a plurality of subsets of the features to an area of the receiver element. For each subset, the method comprises operating an imaging head comprising a plurality of channels while moving the channels relative to the receiver element in a scan direction, wherein the area is narrower in a sub-scan direction transverse to the scan direction than a swath of the imaging head. The transfer of the non-contiguous features of each subset is completed in one scan of the imaging head. The features are separated by gaps that are at least 1 channel wide, and are typically two or more channels wide. Each of the features is made by a group of at least two adjacent channels.

Further aspects of the invention and features of embodiments of the invention are described below.

BRIEF DESCRIPTION OF THE DRAWINGS

The present invention will be more readily understood from the detailed description of exemplary embodiments presented below considered in conjunction with the attached drawings, in which:

FIG. 1A is a plan view of a portion of a conventional color filter configuration;

FIG. 1B is a plan view of a portion of another conventional color filter configuration;

Figure 2:
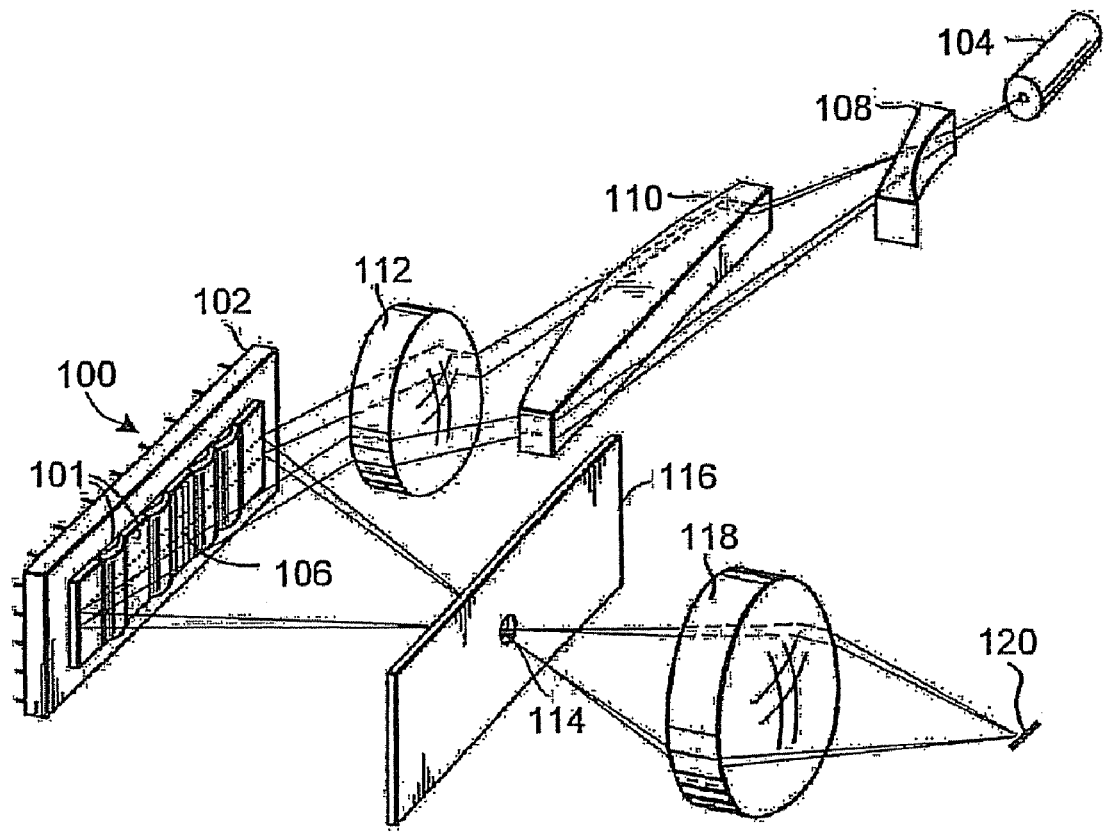
FIG. 2 is a schematic view of the optical system of a conventional multi-channel imaging head.

It is to be understood that the attached drawings are for purposes of illustrating the concepts of the invention and may not be to scale.

LISTING OF REFERENCE NUMEERALS

The following reference numerals are used in the drawings.
10 color filter                     38 first position
12 (red) color element              38' new position
13 (green) color element            40 individually addressable imaging
14 (blue) color element             channels
18 receiver element                 41 broken lines
20 black matrix                     42 main-scan direction
22 areas                            44 sub-scan direction
24 donor element                    45 last channel
26 multi-channel imaging head       46 first channel
30 red stripe,                      47 discontinuity
32 red stripe                       48 channel sub-group
34 red stripe                       50 pattern of non-contiguous features
34' portion                         51 non-contiguous feature
34" portion                         52 channel subgroup
36 red stripe                       100 linear light valve array
101 deformable mirror elements      212 imageable media
102 semi-conductor substrate        220 translation unit
104 laser                           230 systems controller
106 illumination line               240 data
108 cylindrical lens                250 program product
110 cylindrical lens                300 method step
112 lens                            310 method step
114 aperture                        320 method step
116 aperture stop                   330 method step
118 lens                            340 method step
120 image-wise modulated beam
200 system
210 housing

DESCRIPTION

Throughout the following description specific details are presented to provide a more thorough understanding to persons skilled in the art. However, well-known elements may not have been shown or described in detail to avoid unnecessarily obscuring the disclosure. Accordingly, the description and drawings are to be regarded in an illustrative, rather than a restrictive, sense.

This invention relates to imaging patterns of non-contiguous features. The patterns may include repeating patterns or non-repeating patterns. The patterns are not necessarily regular patterns. A non-contiguous feature is a feature that is separated from other features at least in a sub-scan direction. Features can be formed by directing imaging beams along a scan direction and a non-contiguous feature is a feature that can be separated from other features at least in a direction transverse to the scan direction. In some embodiments the non-contiguous features are macroscopic graphic entities (i.e. entities that are large enough to be resolved by the unaided human eye). In some such embodiments the non-contiguous features have dimensions in a sub-scan direction that are at least $\frac{1}{20}$ mm.

Color elements of one color from color filters of the type used in LCD display panels are an example of non-contiguous elements. Color filters used in LCD display panels typically comprise patterns of color elements of each of a plurality of colors. The color elements may include red, green and/or blue color elements, for example. The color elements may be arranged in any of various suitable configurations. For example:

Stripe configurations, shown in FIG. 1A, have alternating columns of red, green and blue;

Mosaic configurations shown in FIG. 1B, have color elements alternating in both dimensions of the mosaic;

Delta configurations (not-shown) having red, green and blue filter elements in a triangular relationship to each other are also used.

FIG. 1A shows a portion of a conventional "stripe configuration" color filter 10 having a plurality of red, green and blue color elements 12, 14 and 16 respectively formed in alternating columns across a receiver element 18. Color elements 12, 14 and 16 are outlined by portions of a black matrix 20, which divide the elements. Black matrix 20 can help to prevent any backlight leaking between the elements. The columns are commonly imaged in elongate stripes and then subdivided by the black matrix 20 into individual color elements 12, 14 and 16. TFT transistors on the associated LCD panel (not shown) are typically masked by portions 22 of the black matrix.

FIG. 1B shows a portion of a conventional color filter 10 arranged in a mosaic configuration in which color elements 12, 14 and 16 alternate down the columns as well as across the columns. It is to be noted that the color filters are not limited to the red, green and blue color sequence shown in FIGS. 1A and 1B and other color sequences may also be employed.

Typically, during the manufacture of a color filter 10, each of the color elements 12, 14 and 16 can either partially or completely overlap the respective portions of the black matrix 20 that outline each respective color element. Overlapping the black matrix can reduce the registration issues that would be encountered if one were to try to apply color to a given color element exactly within the boundaries of that element which are delineated by corresponding portions of the black matrix 20.

Color elements may be applied by "thermal transfer" processes. Thermal transfer processes can include laser-induced thermal transfer processes. Thermal transfer processes can include the image-wise transfer of dyes and other suitable image-forming materials, such as pigments and similar colorant compositions. Thermal transfer processes can include the transfer of a colorant and a binder.

Where a thermal transfer process is used to produce color elements, edge discontinuities and various artifacts such as pinholes may occur when each successive color donor is removed post-imaging. These artifacts may occur because the colored image forming material that has been transferred at the edges may not have sufficient adhesive peel strength to remain attached to the dye-receiver element when the color donor is peeled off. Overlapping the black matrix 20 can hide any such edge discontinuities and may help to ensure that the desired contrast between the respective color elements is achieved since "colorless" voids within the color elements themselves would be reduced.

Figure 3:
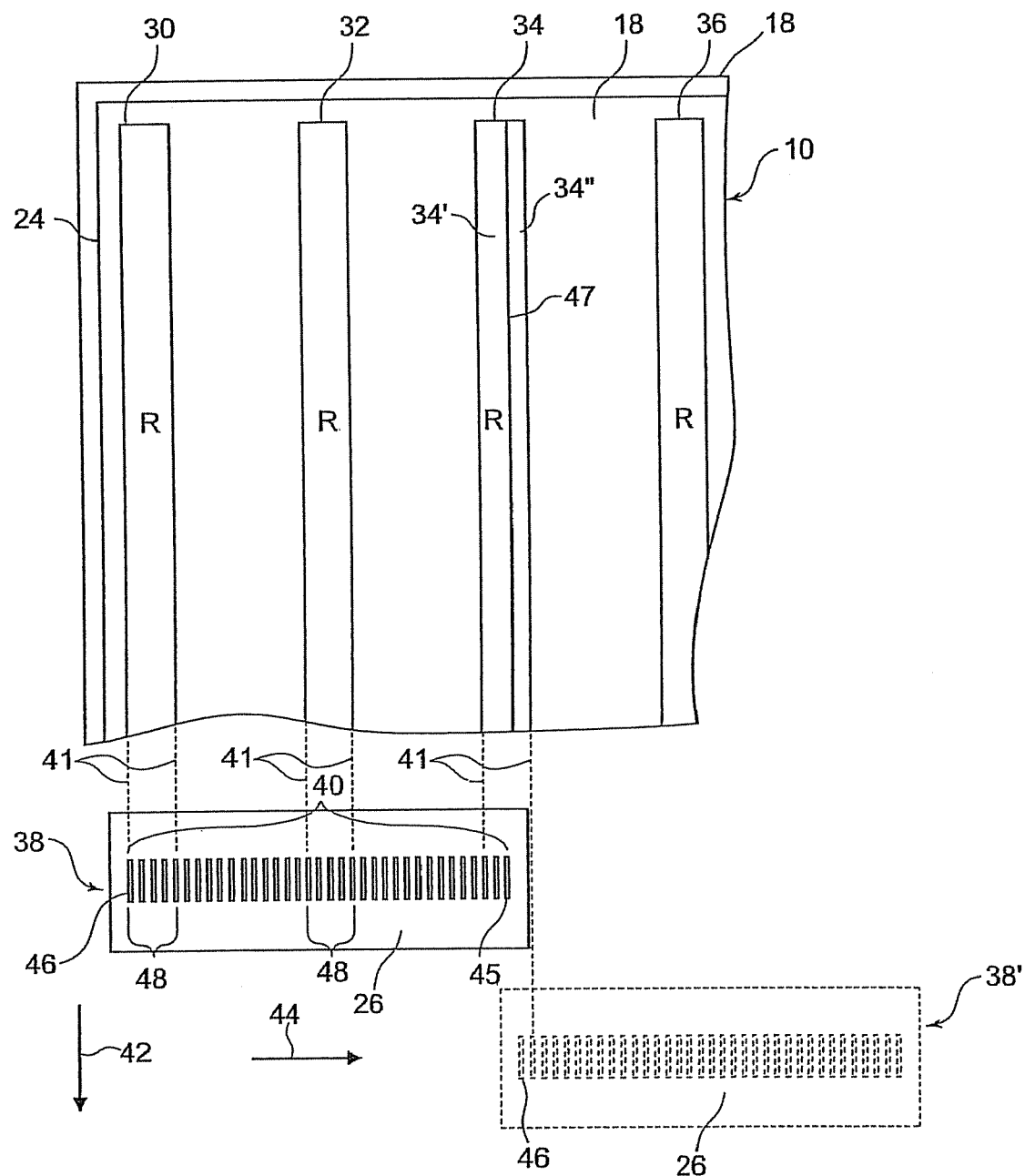
FIG. 3 is a schematic view of a multichannel imaging head conventionally imaging an imageable medium with a pattern of non-contiguous features.

FIG. 3 schematically shows a conventional thermal transfer process being used to fabricate a color filter 10. This process involves directly imaging a medium with a multi-channel imaging head 26. In this case the medium includes a color donor element 24 appropriately arranged with a receiver element 18. The receiver element 18 typically has a black matrix 20 (not shown) formed on it. Although a thermal transfer process can itself be used to produce a black matrix 20, the black matrix 20 is typically formed by lithographic techniques that can provide the required accuracy, as well as avoid any edge artifacts and discontinuities from forming within the black matrix 20 itself Donor element 24 includes an image forming material (not shown) that can be image-wise transferred onto the receiver element 18 by operation of multi-channel imaging head 26.

Red, green and blue portions of the filter are typically imaged in separate imaging steps; each imaging step involves replacing the preceding color donor element with the next color donor element to be imaged. Each of the red, green and blue portions of the filter are typically transferred to receiver element 18 such that each of the color portions is in register with the respective portions of the black matrix that delineate each of the color elements. After all of the color elements have been transferred, the imaged color filter can undergo an additional annealing step to change one or more physical properties (e.g. hardness) of the imaged color elements.

A conventional laser-based multi-channel imaging head that employs a light valve to create a plurality of imaging channels is shown schematically in FIG. 2. A linear light valve array 100 includes a plurality of deformable mirror elements 101 fabricated on a substrate 102. Mirror elements 101 can be micro-miniature (QEMS) deformable mirror micro-elements. A laser 104 can generate an illumination line 106 using an anamorphic beam expander comprising cylindrical lenses 108 and 110. The illumination line 106 is laterally spread across the plurality of elements 101 so that each of the mirror elements 101 is illuminated by a portion of illumination line 106. U.S. Pat. No. 5,517,359 to Gelbart describes a method for forming an illumination line.

A lens 112 typically focuses laser illumination through an aperture 114 in an aperture stop 116 when elements 101 are in their un-actuated state. Light from actuated elements 101 is blocked by aperture stop 116. A lens 118 images light valve 100 to form a plurality of individual image-wise modulated beams 120, which can be scanned over an area of a substrate to form an imaged swath. Each of the beams is controlled by one of the elements 101 and each of the beams is operable for imaging, or not imaging an "image pixel" on the imaged substrate in accordance with the state of the corresponding element 101. In this regard each of the elements 101 controls one channel of a multi-channel imaging head.

The receiver element 18, or the multi-channel imaging head 26, or a combination of both, are displaced relative to one another while the channels of imaging head 26 are controlled in response to image data to create imaged swaths. In some embodiments the imaging head is stationary and the receiver element moves; in other embodiments the receiver element is stationary and the imaging head moves; and in still other embodiments, both of the imaging head and the receiver element are moved to produce the desired relative motion between the imaging head and the receiver element along one or more scan paths.

When imaging relatively rigid receiver elements 18, as is common in fabricating display panels, the imager used is usually a flatbed imager that includes a support that secures a receiver element 18 in a flat orientation. U.S. Pat. No. 6,957, 773 to Gelbart discloses an example of a high-speed flatbed imager suitable for display panel imaging. Alternatively, flexible receiver elements 18 may be secured to either an external or internal surface of a "drum-type" support to affect the imaging of the swaths. Even a receiver element that is traditionally thought of as rigid, such as glass, may be imaged on a drum-based imager provided that the substrate is sufficiently thin and the diameter of the support is sufficiently large.

FIG. 3 schematically shows a portion of a color filter receiver element 18 that has been patterned with a plurality of red stripes 30, 32, 34 and 36 in a laser-induced thermal transfer process. In this process, a donor element 24 which includes an image forming material (again, not shown) is appropriately positioned on receiver element 18 and the plurality of red stripes 30, 32, 34 and 36 are imaged on receiver element 18 by transferring portions of the image forming material onto receiver element 18. In FIG. 3, donor element 24 is shown smaller in size than receiver element 18 for the purposes of clarity only, and can overlap one or more portions of receiver element 18 as may be required.

Each of the red stripes 30, 32, 34 and 36 need not be only as wide as the final visible width of the color elements but may be of sufficient width to partially overlap the black matrix vertical segments (not shown) that delineate each red element within each respective stripe. Each successive imaging of a color donor element requires imaging a repeating pattern of non-contiguous features. Stripes 30, 32, 34 and 36 are an example of such a pattern of non-contiguous features. Each of the stripes 31, 32, 34 and 36 are spatially separated from one another along a sub-scan direction 44. Multi-channel imaging head 26 includes a plurality of individually addressable imaging channels 40, and is located in a first position 38. FIG. 3 depicts the correspondence between the imaging channels 40 and the transferred pattern by broken lines 41.

Figure 4A:
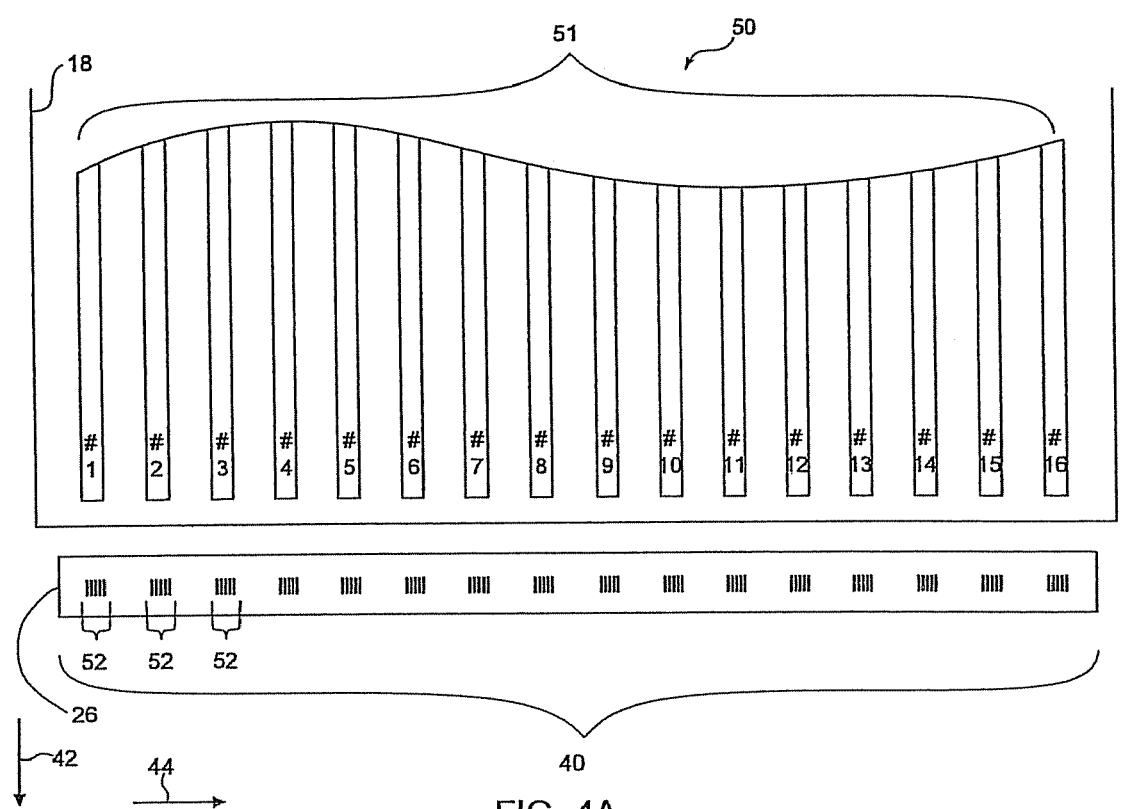
FIG. 4A is a schematic view of a 240 channel imaging head in relation to an imageable media as imaged using a conventional imaging technique.

While multi-channel imaging head 26 is shown in FIGS. 3, and 4A at the same scale as the imaged pattern, these schematic illustrations are only intended to show the correspondence between the imaging channels 40 and their respectively imaged features and not necessarily a physical relationship. In practice, as shown in FIG. 2, the imaging beams are directed onto the substrate to be imaged by one or more lenses, which may reformat the size and shape of the imaging swath at the plane of the substrate.

The imaging beams generated by multi-channel imaging head 26 are scanned over receiver element 18 in a main-scan direction 42 while being image-wise modulated according to the pattern of non-contiguous features to be written. Sub-groups of channels like channel sub-group 48 are driven appropriately to produce active imaging beams wherever it is desired to form a non-contiguous stripe feature. Other channels not corresponding to the features will be driven appropriately to not image corresponding areas. If all of the imageable channels of the multi-channel imaging bead 26 are driven to image corresponding pixels, imaging head 26 can produce an imaged swath whose width would be related to the distance between the first pixel imaged by a first in the array and the last pixel as imaged by a last channel in the array. Since the receiver element 18 is typically too large to be imaged within a single imaged swath, multiple scans of the imaging head are typically required to complete the imaging. In this case, each imaged swath is followed by a translation of the multi-channel imaging head 26 in sub-scan direction 44 so that a subsequent imaged swath will generally be lined up alongside the previous imaged swath.

As represented in FIG. 3, movement of multi-channel imaging head 26 along sub-scan direction 44 occurs after the imaging of each swath in the main-scan direction 42 is completed. Alternatively, multi-channel imaging head 26 may be translated relative to receiver element 18 along sub-scan direction 44 in synchrony with the main-scan motion, in order to compensate for potential skew between the main-scan direction effected by the imaging system, and the desired placement of the image with respect to the receiver element 18. Alternatively, in drum type imagers it is possible to simultaneously image in both the main-scan 42 and sub-scan directions 44, thus writing the image in a helix.

There are typically several options for aligning a previously imaged swath to a subsequently imaged swath. These options can include overlapping the previously- and subsequently-imaged swaths by one or more imaged pixel widths. Alternatively, the first imaged pixel of the subsequently imaged swath can be spaced from the last imaged pixel of the previously imaged swath by a distance related to a pitch distance between imaged pixels.

Referring back to FIG. 3, red stripes 30, 32 and portion 34' of stripe 34 are imaged during a first scan of the imaging head. On completion of the first scan, multi-channel imaging head 26 (in first position 38) is displaced in the sub-scan direction 44 to a new position 38' (shown in broken lines and offset from position 38 for the sake of clarity). In this example, the sub-scan displacement shown in FIG. 3 is related to the number of channels available on multi-channel imaging head 26 (in this case 35 channels). It is understood that multi-channel imaging head 26 can comprise any suitable plurality of channels and is not limited to the 35 channels described in this example. The displaced multi-channel imaging head 26 at new position 38' locates the first channel 46 adjacent to the previous position of the last channel 45 of imaging head 26 at first position 38 thus imaging a portion 34" of stripe 34. It is very difficult to avoid the appearance of a visible discontinuity shown as line 47 at the boundary between portions 34' and 34" of stripe 34. This visible discontinuity between adjacent imaged swaths can lead to banding.

Even very small power differences (on the order of 1%) in the output power of the imaging channels can affect an imaged characteristic (e.g. optical density or color density) of the transferred image forming material by varying the amount of image forming material that is transferred. The donor elements 24 employed in thermal transfer processes typically have limited imaging latitude, and are thus considered to have non-linear imaging properties. Non-linear imaging properties can further exacerbate efforts to reduce artifacts such as banding.

Banding may become more pronounced when a repeating pattern of non-contiguous features, such as a color filter, is produced. When imaging a repeating pattern of non-contiguous features, banding may be dominated by differing imaged characteristics associated with the outlying or "outboard" imaged non-contiguous features in comparison with the interior or "inboard" non-contiguous features imaged in a given swath.

FIG. 4A depicts a portion of a receiver element 18 imaged in a laser-induced thermal transfer process. A repeating pattern of non-contiguous features 50 is imaged on a portion of a receiver element 18. In this example, repeating pattern 50 is made up of sixteen non-contiguous features 51. In this example pattern 50 corresponds to a single swath imaged by a multi-channel imaging head 26. In other words, the pattern 50 of non-contiguous features is imaged in a single swath and is thus imageable during a single scan of multi-channel imaging head 26.

The repeating pattern 50 of non-contiguous features may form a portion of another pattern such as a color filter. In this example, each of the non-contiguous features 51 comprises a non-contiguous stripe feature. Each non-contiguous feature 51 is identified by one of the following feature numbers: #1, #2, #3, #4, #5, #6, #7, #8, #9, #10, #11, #12, #13, #14, #15 and #16. In this case the feature numbers identify each of the non-contiguous features 51 and also indicate the position of each feature 51 within the imaged pattern 50.

In this example, each of the non-contiguous features 51 is imaged by a subgroup 52 of imaging channels 40. In this example, each subgroup 52 is made up of 5 contiguous imaging channels 40. It is to be noted that in this example, multi-channel imaging head 26 is made up of 240 individual imaging channels 40. In the interest of clarity only those imaging channels 40 corresponding to sub-groups 52 are shown. In this example, each imaging channel 40 is capable of imaging a pixel that is approximately 20 microns wide and thus each subgroup of imaging channels images a non-contiguous feature 51 that is approximately 100 microns wide (along sub-scan direction 44). Each of the non-contiguous features 51 is imaged by five contiguous raster lines as each of the corresponding subgroup 52 of imaging channels is driven in an image-dependant manner as imaging head 26 is scanned along main-scan direction 42. Each of the striped features 51 are arranged along sub-scan direction 44 with a pitch of approximately 300 microns.

FIG. 4A schematically depicts imaging a first color donor element 24 (not shown) positioned on a receiver element 18. Subsequent scans with additional color donor elements are typically required to complete the color filter. In these subsequent scans, other differently-colored non-contiguous stripe features may be imaged in the spaces between the non-contiguous stripe features 51 shown in FIG. 4A.

Figure 4B:
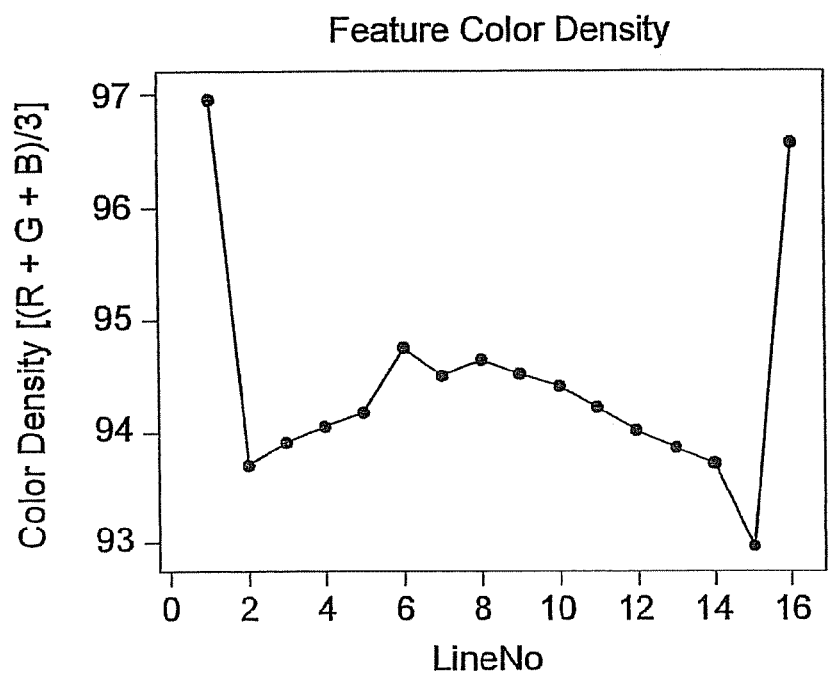
FIG. 4B is a graph of measured color density of each of the non-contiguous color features shown in FIG. 4B.
Figure 5:
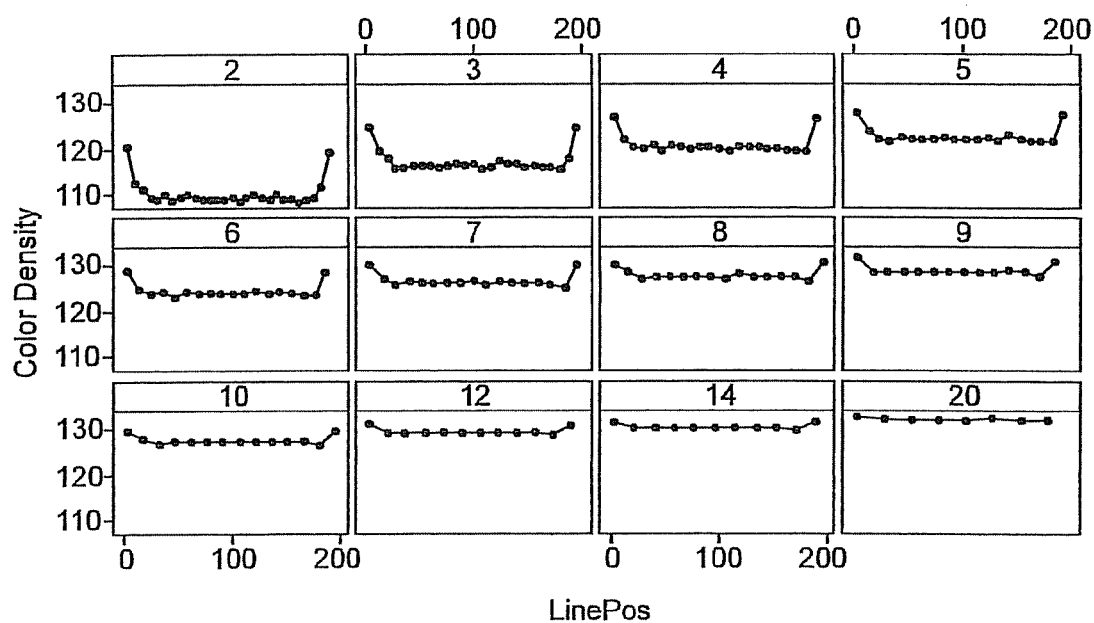
FIG. 5 is a sequence of graphs of a color density variance of each member of a pattern of non-contiguous features as a function of the distance between each of the features, as per an example embodiment of the present invention.
Figure 6:
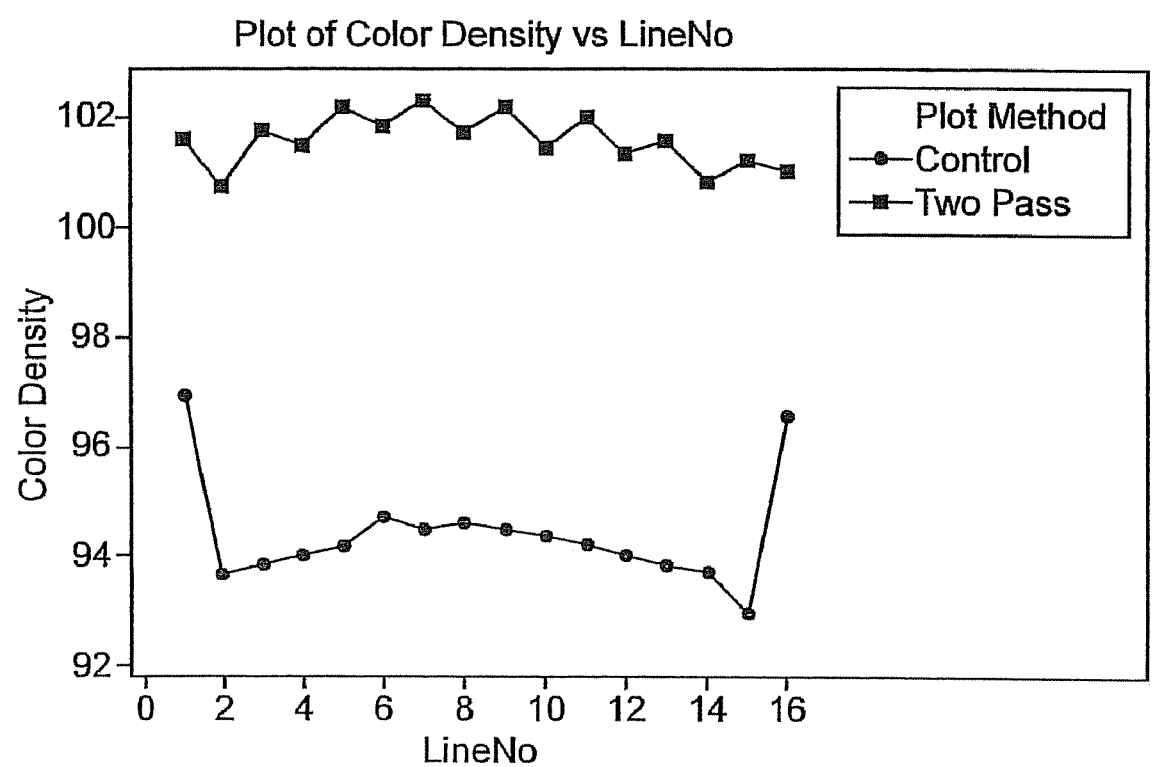
FIG. 6 is a graph defining the feature specific color density of the pattern of 16 non-contiguous features shown in FIG. 4A imaged in accordance with an example embodiment of the invention as compared to the pattern as imaged by a conventional method.

In the graphs shown in FIGS. 4B, 5 and 6, color density values are represented by (R+G+B)/3 light intensity levels as determined, for example, by a spectrophotometer used to measure each non-contiguous feature. In the measured scale, 255 represents a maximum measured light intensity, and 0 represents a minimum measured light intensity. Color density varies inversely with light intensity. Accordingly, higher light intensity values correspond to lower color density values.

FIG. 4B shows that the color densities of outboard non-contiguous features #1 and #16 are noticeably lower (i.e. higher measured light intensity) than the color densities of inboard features #2 though #15. This "feature" specific density variation along with the repeating nature of the non-contiguous features can create a beating effect that emphasizes banding between adjacent swaths.

FIG. 4B represents the results of an imaging of a first color donor element positioned on a receiver element 18. Subsequent imaging steps with additional color donor elements may produce similar graphs, although the magnitude of density variations between the imaged non-contiguous features may vary from those shown in FIG. 4B.

Although various adjustments of multi-channel imaging head 26 may produce some changes to the feature density profile shown in FIG. 4B, the inventors have found that such adjustments typically have an undesirably small effect on such "feature-based" density variations. These feature-based density variations may be observable when receiver element 18 includes a glass substrate as well when receiver element 18 includes an additional black matrix formed on a glass substrate. These feature based density variations may be observable before, and after any annealing of the images.

FIG. 6 shows a graph containing two plots (i.e. the "Control" plot and the "Two Pass" plot) which compare feature-specific color densities of a pattern of sixteen striped non-contiguous features 50 imaged in accordance with two cases. In both cases, the pattern of non-contiguous features 50 is identical to that shown in FIG. 4A. In both cases, each of the sixteen imaged non-contiguous features 51 comprises a striped feature approximately 100 microns in sub-scan width. Each of the striped features 51 are arranged along sub-scan direction 44 with a pitch of approximately 300 microns.

The "Control" plot corresponds to a first case involving a conventional imaging of the pattern of sixteen non-contiguous features 50 as previously described and represented by the plot shown in FIG. 4B. In the "Control" plot, all of the non-contiguous features 51 (i.e. the features numbered #1, #2, #3, #4, #5, #6, #7, #8, #9, #10, #11, #12, #13, #14, #15, and #16) were conventionally imaged during a single scan of the multi-channel imaging head 26. That is, all of the sixteen non-contiguous features 51 were created in a single imaged swath created by the imaging head 26.

The "Two Pass" plot corresponds to the same pattern of sixteen non-contiguous features 50 shown in FIG. 4A, but imaged according to an example embodiment of the invention. In the "Two Pass" plot the non-contiguous stripe features 51 (i.e. numbered #1, #2, #3, #4, #5, #6, #7, #8, #9, #10, #11, #12, #13, #14, #15, and #16) are imaged during a plurality of scans of the multi-channel imaging head 27. Some of the sixteen non-contiguous features 51 are imaged during a first scan of the multi-channel imaging head 26 while other non-contiguous features 51 are imaged during an additional scan of the multi-channel imaging head. As noted above, all of the of the sixteen non-contiguous features 51 could be completely imaged during a single scan of the multi-channel imaging head.

Specifically, in the example embodiment of the invention represented by the "Two Pass" case, a first scan of the multi-channel imaging head 26 images a first set of non-contiguous features 51 from the pattern 50 of non-contiguous color features while a second scan of the multi-channel imaging head 26 images an additional set of the non-contiguous features 51 from pattern 50. In the "Two Pass" case, members of the additional set are imaged in a interleaved fashion with members of the first set. The first and second scans may be performed in the same direction or in opposing directions. (i.e. the multi-channel imaging head may be moved relative to the receiver element in the same direction or in opposite directions during the first and additional scans). The multi-channel imaging head may have the same position in the sub-scan direction for both the first and second scans or may be shifted in the sub-scan direction between the first and second scans.

In both the Control case and the Two Pass case, the complete pattern of sixteen non-contiguous features 50 is no wider than one swath so that all of the features are imageable during a single scan of the multi-channel imaging head 26.

Interleaving the non-contiguous features involves taking the non-contiguous features in at least two groups. A first set comprising at least first and second non-contiguous features is imaged during a first scan of a multi-channel imaging head. A second set comprising at least a third one of the non-contiguous features that is located between the first and second non-contiguous features is imaged between the imaged first and second non-contiguous features during an additional scan of the multi-channel imaging head.

At least one set of two or more sets (each set being made up of one or more selected non-contiguous features) may be interleaved with at least one additional set of the two or more sets. In the example embodiment represented by FIG. 6, non-contiguous features #1, #3, #5, #7, #9, #11 and #13 are imaged during a first scan of imaging head 26 while non-contiguous features #2, #4, #6, #8, #10, #12, #14 and #16 are imaged during a second scan of the imaging head. Imaged non-contiguous features #2, #4, #6, #8, #10 #12, #14 and #16 are interleaved with imaged non-contiguous color stripe features #1, #3, #5, #7, #9, #11 and #13.

As shown in FIG. 6, the conventionally imaged "Control" plot shows relatively significant color density variations between imaged non-contiguous features #1 and #16 when compared to the rest of the imaged non-contiguous features #2, #3, #4, #5, #6, #7, #8, #9, #10, #11, #12, #13, #14 and #15. Being primarily concentrated at the edges of the imaged swath, these density variations can lead to banding effects between adjacent swaths that may negatively impact final image quality. The "Two Pass" plot imaged in accordance with an example embodiment of the invention shows relatively minor color density variations between imaged "outboard" non-contiguous features #1 and #16 when compared to the rest of the imaged "inboard" non-contiguous features

2, #3, #4, #5, #6, #7, #8, #9, #10, #11, #12, #13, #14 and #15. The "Two Pass" plot shows that minor density variations exist between each of the selected non-contiguous stripe features imaged during each scan.

Further, the relative amount of feature specific density variations associated with each of the scans of the "Two Pass" case are comparable with the relative amount of feature specific density variations associated with the "inboard" features imaged during a single scan during the "Control" plot case. That is, the "Two Pass" plot shows that the relative amount of density variations associated with the imaging of non-contiguous features #1, #3, #5, #7, #9, #11 and #13 during a first scan, and non-contiguous stripe features #2, #4, #6, #8, #10 #12, #14 and #16 during a second scan are comparable to each other and to the relative amount of density variations associated with the imaging of inboard non-contiguous features #2, #3, #4, #5, #6, #7, #8, #9, #10, #11, #12, #13, #14 and #15 in the "Control" plot case. The "Two Pass" plot shows slightly higher color density variations between adjacently-positioned imaged non-contiguous features 51, but overall, the density variations across all sixteen non-contiguous features 51 in the completely imaged pattern 50 is reduced. As compared to the "Control Plot", the "Two Pass" plot shows that the density variations across all sixteen non-contiguous features 51 in the completely imaged pattern 50 are substantially reduced. Reduced density variations across all of the non-contiguous features 51 of the completely imaged pattern 50 the will typically lead to reduced banding.

It is not necessary that the features in each set of non-contiguous features be evenly-spaced apart from one another. The features may be assigned to each set randomly or according to a predetermined arrangement, for example. Consequently, the features imaged in any one pass may not themselves form a "regular" pattern. Preferably, the minimum spacing between features in any one of the sets is greater than the minimum spacing between features 51 in pattern 50. The minimum spacing between features may vary among the sets. The features are assigned to three or more separately-imaged sets in some embodiments.

It has been determined that the swath edge variations shown in FIG. 4B can depend on the spacing between each of the imaged non-contiguous features 51. As shown in FIG. 5, and in accordance with an aspect of the present invention, it has been determined that when a pattern of non-contiguous features 50 is imaged during a single scan of the imaging head, variations in the imaged characteristics of the imaged outboard non-contiguous features and the imaged inboard non-contiguous features can be reduced by increasing the spacing between each of the non-contiguous features. Reduced variations in the imaged characteristics of the outboard and inboard non-contiguous features have been found to decrease banding.

FIG. 5 shows a sequence of twelve graphs. Each graph records the color density (as a function of a measured light intensity value) for each member of a repeating pattern 50 of non-contiguous features that is imaged during one of twelve separate cases. In each of the twelve separate cases, the pattern 50 of noncontiguous features 51 is imaged during a single scan of a multi-channel imaging head 26. The number of non-contiguous features 51 imaged in each pattern 50 is varied in each case. Since the same swath width and feature size (i.e. in this case, sub-scan width) is maintained during all of the cases, each graph compares the color density of an imaged non-contiguous feature 51 as a function of the sub-scan spacing between adjacent non-contiguous features 51. Each of the graphs represents the results of an imaging of a first color donor element 24 positioned on an approximately 78 micron thick glass receiver element 18 using a multi-channel imaging head 26. Each of the imaged non-contiguous features 51 is represented by the symbol "!" in each graph. In all cases each imaged non-contiguous feature 51 is approximately 100 microns wide along a sub-scan direction associated with the imaging.

Each of the FIG. 5 graphs records variations in an imaged characteristic associated with the imaging of non-contiguous stripe features 51. In this example, the imaged characteristic is color density. As shown in FIG. 5, each graph is identified by one of the following plot numbers: 2, 3, 4, 5, 6, 7, 8, 9, 10, 12, 14 and 20. Each respective plot number corresponds to the number of non-imaged pixels that separated each of the imaged non-contiguous features imaged during their respective imaging. In each case, each imaged or non-imaged pixel was approximately 20 microns in width (i.e. along the sub-scan direction). Accordingly, the graph represented by plot number 2 corresponds to a pattern 50 of non-contiguous features 51 (stripes), wherein each non-contiguous feature 51 is approximately 100 microns in width and is separated from an adjacent feature by a spacing of 40 microns (i.e. a 20 microns pixel width times a 2 pixel feature spacing). The graph represented by plot number 20 corresponds to a pattern 50 of non-contiguous color features 51, wherein each feature is approximately 100 microns in width and is separated from an adjacent feature by a spacing of 400 microns (i.e. a 20 microns pixel width times a 20 pixel feature spacing). In some of the graphs, each individual stripe feature 51 as represented by the "!" symbol may not be clearly distinguishable because of a relatively small spacing between the imaged non-contiguous stripe features associated with that particular graph.

In accordance with an aspect of the invention, variations in the imaged characteristics (i.e. color density in the example of FIG. 5) between adjacent non-contiguous features 51 imaged in a given scan of the multi-channel imaging head can be substantially reduced by increasing the sub-scan spacing between those of the non-contiguous features that are imaged at one time.

It will be apparent to those skilled in the art from FIG. 5 that when each of the approximately 100 micron wide non-contiguous features 51 is separated by approximately 300 to 400 microns, variations in the imaged characteristics of the features 51 imaged within the swath can be reduced as shown by the graph labeled plot 20. Reduced variations between the imaged non-contiguous features will typically reduce image artifacts such as banding.

Banding may be related to thermal effects especially in the case of a laser-induced thermal transfer process. These thermal effects may be attributable to thermal interactions between adjacently positioned imaged raster lines. Each raster line is made up of columns of pixels, each column being typically aligned in a main-scan imaging direction associated with the imaging head employed to image the raster lines. During the thermal transfer process, thermal energy is typically released as each pixel is imaged. The imaging of a given pixel may create a thermal energy profile that extends beyond the spatial boundaries of the imaged pixel into areas where adjacent pixels are to be imaged. Since the imaging of any given pixel is dependant on the image data instructions for that pixel, image-dependant thermal exposure profiles will likely create varying imaging conditions for adjacently imaged pixels thus potentially creating variations among the imaged pixels. The position of each of the pixels imaged within a single swath may also lead to noticeable variations among the pixels. The pixels located within the interior of the swath may typically be exposed to more thermal energy than the pixels located at the outboard ends of the swaths. Variations in the imaged pixels may lead to banding and/or other undesirable image characteristics.

Although banding may result from thermal variations, other phenomenon directly attributable to the thermal transfer process itself and/or its associated media can contribute significantly to banding and other various artifacts in the final image. Such phenomenon can include mechanical factors. One example of a mechanical factor can occur when multiple donor elements are consecutively imaged onto the same receiver element. Variances in the in the final image created by a laser-induced thermal transfer process can arise when a second color donor element is imaged over an existing pattern imaged on the receiver element by a previously imaged color donor element. In this situation, the image forming material transferred to the receiver element has a distinct thickness. This thickness can create variations in the spacing between the second color donor element and the receiver element and can affect the degree of transfer of the image forming material during the imaging of the second color donor.

The plots shown in FIG. 4B, show that the spacing between non-contiguous features 51 imaged during a single scan of the multi-channel imaging head will typically affect a desired imaged characteristic of each of the imaged features. The plots shown in FIG. 6 show that the presence or absence of a given non-contiguous feature imaged during a given scan may affect a desired imaged characteristic of another feature imaged during that scan.

Without limitation, possible causes for the effects represented by FIGS. 4B, 5 and 6 may be mechanical in nature. A mechanical deformation of a donor element 24 can occur during the process of imaging. During the laser-induced thermal transfer imaging process, a portion of the image forming material of the donor element 24 may not be transferred to the underlying receiver element, but rather, may undergo a phase change into a gaseous state. A mechanical deformation of the donor element 24 can arise due to a "gaseous bubble formation" created between the donor element 24 and the receiver element 18 during the imaging The imaging of a given feature may cause a mechanical deformation of a given portion of donor element 24 corresponding to the imaged feature as well as portions of donor element 24 adjacent to that portion. The mechanical deformation of the donor element created by the imaging of the given portion of donor element 24 may give rise to an additional spacing between the donor element 24 and the receiver element 18 in the adjacent portions of donor element 24. Any additional features imaged in these adjacent portions of donor element 24 can be subject to variations in their imaged characteristics due to this increased donor-to-receiver element spacing. Measurable variations in these imaged characteristics can include, but are not limited to, varying amounts of image forming material being transferred, varying optical properties of such as optical and/or color densities, and different sizes (in one or both of the main-scan and sub-scan directions) of the imaged features.

Even where each of the non-contiguous features 51 is separated from its neighbors sufficiently to minimize or substantially preclude thermal energy associated with the imaging of a given non-contiguous feature from affecting the imaging of adjacent, neighboring non-contiguous features, other factors may lead to image quality deficiencies as illustrated in the "Control" plot of FIG. 6. Image artifacts such as banding may arise from factors that can include, but are not limited to, the sub-scan width of each of the imaged non-contiguous features 51, the sub-scan spacing between the imaged non-contiguous features 51 and the mechanical properties (e.g. stiffness) of the donor element 24 and receiver element 18.

Figure 7:
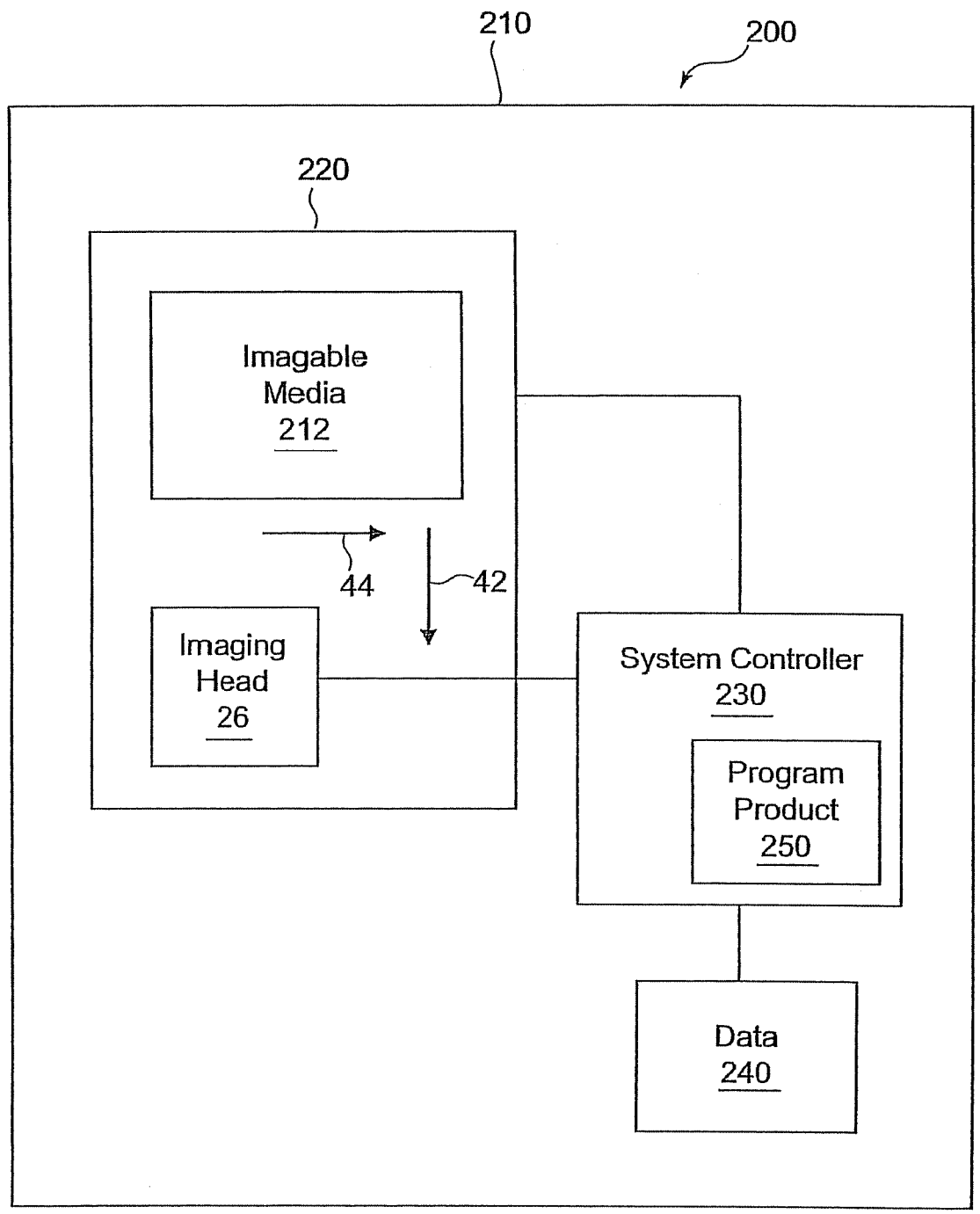
FIG. 7 is a schematic representation of a system according to an example embodiment of the invention; and, FIG. 8 is a flow chart illustrating steps associated with a method according to an example embodiment of the invention.
Figure 8:
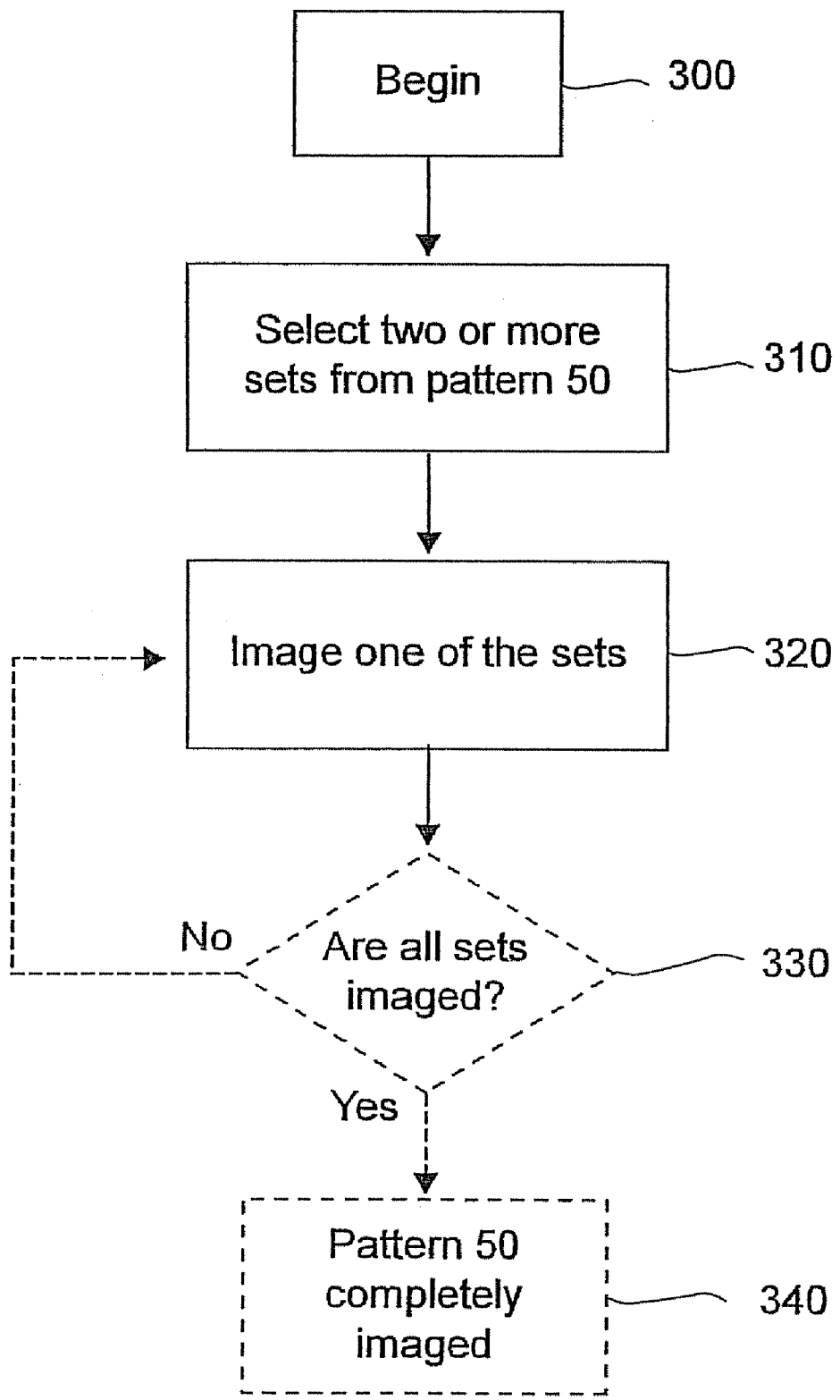

FIG. 7 schematically shows a system 200 according to an example embodiment of the invention. FIG. 8 shows a flow-chart describing a mode of operation that system 200 or other suitable systems can be operated with in accordance with an example embodiment of the invention. FIG. 7 includes a housing 210 that can include any suitable open or closed box, frame or enclosure. By way on non-limiting example, housing 210 can include a clean room, operable for controlling various environmental conditions including air-borne contaminants. Housing 210 holds a multi-channel imaging head 26, a translation unit 220 that establishes relative motion between an imageable media 212 and a multi-channel imaging head 26 during the imaging of the imageable media 212 by imaging head 26. This relative motion can be along a sub-scan direction 44 and/or a main scan direction 42 associated with the imaging.

Imageable media 212 can include a donor element 24 and a receiver element 18 (both not shown). System 200 also includes systems controller 230. Systems controller 230 may include a micro-computer, micro-processor, micro-controller or any other known arrangement of electrical, electromechanical and electro-optical circuits and systems that can reliably transmit signals to multi-channel imaging head 26 and translation unit 220 to image imageable media 212 in accordance with various data inputs to systems controller 230. Systems controller 230 may include a single controller or it may include a plurality of controllers.

As shown in FIG. 7, data 240 representing a pattern 50 of non-contiguous features (not shown) is input to system controller 230. Without limitation, the pattern 50 of non-contiguous features can represent a pattern of color features, the pattern of color features forming a portion of a color filter.

Referring to the flow chart shown FIG. 8, as performed by system 200, systems controller 230 commences the start of the imaging process in accordance with the inputted data 240 in "begin" step 300. A program product 250 can be used by systems controller 230 to perform various functions required by system 200.

Without limitation, program product 250 may comprise any medium which carries a set of computer-readable signals comprising instructions which, when executed by a computer processor, cause the computer processor to execute a method of the invention. The program product 250 may be in any of a wide variety of forms. The program product 250 may comprise, for example, physical media such as magnetic storage media including floppy diskettes, hard disk drives, optical data storage media including CD ROMs, DVDs, electronic data storage media including ROMs, flash RAM, or the like or transmission-type media such as digital or analog communication links. The instructions may optionally be compressed and/or encrypted on the medium.

As noted above, non-contiguous features may be divided into sets to be imaged separately in a random (including quasi-random) manner or according to a pre-defined arrangement (such as providing N sets that each include every Nth non-contiguous feature). In the illustrated embodiment, the non-contiguous features to be included in each set are selected based upon analysis of the pattern of non-contiguous features 50. In this embodiment, one function performed by controller 230 is analyzing the pattern of non-contiguous features 50 in data 240 and selecting two or more sets each containing specific non-contiguous features 51 (also not shown) to be imaged together.

In step 310, controller 230 operates according to program product 250 and analyzes data 240 and selects two or more sets of non-contiguous features 51 from a pattern of the non-contiguous features 50. Each set comprises a selected one or more non-contiguous features 51. In step 320, systems controller 230 provides instructions to multi-channel imaging head 26 and translation unit 220 to image imageable media 212 with one of the two or more sets of selected non-contiguous features during a single scan of imaging head 26.

Referring back to step 310, the process of selecting non-contiguous features 51 from the pattern of non-contiguous features 50 for each given set can include selecting the non-contiguous features 51 from pattern 50 such that each of the selected non-contiguous features 51 are separated from one another by a sub-scan spacing sufficient to ensure that each of the selected features are imaged with substantially the same imaged characteristics during the corresponding single scan of multi-channel imaging head 26.

An example of a measure that can be used to compare an image characteristic of two imaged features is the value) E that represents color differences in the CIE 1976 L*, a*, b* ("CEELAB") system as defined by the Commission Internationale de l'Eclairage (CIE). In some embodiments the spacing is sufficient to achieve) E between non-contiguous features 51 of pattern 50 of 3 or less, 2 or less, and preferably 1 or less in some applications. In demanding applications) E may be 0.7 or less (e.g. about ½ or less). Where features 51 have) E values that meet one of these criteria then the features can be said to have an image characteristic (CIE color) that is substantially the same.

Color density is another image characteristic that can be compared among imaged features.

In some embodiments, the thickness of deposited colorant and the uniformity of that thickness across the feature 51 in the sub-scan direction is maintained substantially the same among features 51. This can be expressed in terms of a "lip height". Lip height is the maximum line height (tcf line thickness) minus the average height (tcf line thickness in the middle 25% of the line). Lip height and/or the difference between lip height on one side of a feature 51 and lip height on the other side of the feature 51 may be made to be substantially the same for all features 51. Average thickness of deposited colorant may be made to be substantially the same for all features 51.

All of the two or more sets can jointly include all of the non-contiguous features 51 in pattern 50. Accordingly, the pattern of non-contiguous features 50 is completely imaged after all the sets are individually imaged. If this situation is desired, system controller 230 can include optional step 330 (drawn in broken lines). In step 330, systems controller 230 determines if all of the two or more sets have been imaged during separate scans of multi-channel imaging head 26. Accordingly, each remaining un-imaged set is imaged separately until the pattern of non-contiguous features 50 has been completely imaged in step 340.

Referring back to step 310 the process of selecting non-contiguous features from the pattern of non-contiguous features for each set can include selecting the non-contiguous features 51 from the pattern 50 such that of the selected non-contiguous features 51 are separated from one another by a sub-scan spacing sufficient to ensure that all the of the imaged non-contiguous features 51 in the completely imaged pattern 50 are imaged with substantially the same imaged characteristics. Step 310 can include selecting the non-contiguous features 51 from the pattern 50 such that during successive scans of imaging head 26, additional sets of selected non-contiguous features 51 can be imaged in an interleaved fashion with any previously-imaged set. Step 310 can include selecting a set wherein the selected non-contiguous features 51 within that set are sufficiently spaced apart from one another such that the features are imaged with substantially the same optical properties during a single scan of multi-channel imaging head 26.

In one example embodiment of the invention, program product 250 can configure controller 230 to analyze data 240 and automatically select the two or more sets of non-contiguous features 51 from a pattern 50 of the non-contiguous features 51 in step 310. Automatic selection of the non-contiguous features may be made on the basis of various algorithms inputted to, or programmed within program product 250. These various algorithms can include, but are not limited to, selecting each non-contiguous feature within each set on the basis of: a sub-scan width of at least one of the non-contiguous features, a stiffness of the donor element, a stiffness of the receiver element, the image forming material including any state changes it undergoes when imaged, and the amount of image forming material transferred to the receiver element during the imaging of a selected non-contiguous feature. These algorithms may be experimentally-derived or simulated.

In other embodiments of the invention, program product 250 can configure controller 230 to allow an operator to manually guide the selection of the two or more sets of non-contiguous features from a pattern 50 of the non-contiguous features 51 in step 310 by way of an appropriate user interface.

During step 330, relative motion along sub-scan direction 44 between multi-channel imaging head 26 and imageable media 212 may, or may not occur between each successive scan of multi-channel imaging head 26.

In various example embodiments of the invention, a selected non-contiguous feature 51 is imaged by a corresponding plurality of channels of the multi-channel imaging head 26. Each selected non-contiguous feature 51 may be imaged during a single scan of imaging head 26.

In some example embodiments of the invention, the non-contiguous features can be part of an LCD display. In other example embodiments of the inventions, the non-contiguous features can be part of an organic light-emitting diode (OLED) display. OLED displays can include different configurations. For example, in a fashion similar to an LCD display, different color features can be formed into a color filter used in conjunction with a white OLED source. Alternatively, different color illumination sources in the display can be formed with different OLED materials with various embodiments of the invention. In these embodiments, the OLED based illumination sources themselves control the emission of colored light without necessarily requiring a passive color filter. OLED materials can be transferred to suitable media. OLED materials can be transferred to a receiver element with laser-induced thermal transfer techniques.

A non-contiguous feature may be imaged in a continuous tone or contone process such as dye sublimation. In a continuous tone or contone image, the perceived optical density is a function of the quantity of colorant per pixel, higher densities being obtained by transferring greater amounts of colorant.

A non-contiguous feature can be imaged in accordance with image data that includes halftone screening data. In halftone imaging, the non-contiguous features comprise halftone dots. The halftone dots varying in size according to the desired lightness or darkness of the imaged feature. As previously stated, each channel in a multi-channel imaging head 26 is operable for imaging a pixel on the imageable media. A single halftone dot is typically spatially larger than a pixel. A single halftone dot is typically made up of a matrix of imaged pixels imaged by a plurality of imaging channels. Halftone dots are typically imaged at a chosen screen ruling typically defined by the number of halftone dots per unit length and a chosen screen angle typically defined by an angle at which the halftone dots are oriented. In example embodiments of the invention, a non-contiguous feature may be imaged with a screen density in accordance with the corresponding halftone screen data chosen to image that feature.

The halftone screening employed to image each non-contiguous feature may have a bearing on the selection of non-contiguous features within a set. Sets of non-contiguous features having high screen densities may typically require larger sub-scan spacings between adjacent non-contiguous features imaged during a single corresponding scan than sets of features comprising substantially lower screen densities. In other example embodiments of the invention, a non-contiguous feature may be screened with a stochastic screen in which density requirements are typically determined in accordance with a varying spatial frequency of equally sized dots. In yet other example embodiments of the invention, a non-contiguous feature may be screened with a combined halftone and stochastic screen that is commonly referred to as a hybrid screen.

It is to be understood that any suitable multi-channel imaging head that has individually-addressable channels, each capable of producing a modulated imaging beam, may be used. Without limitation, multi-channel imaging heads 26 used in accordance with example embodiments of the invention can include individually-addressable imaging channels 40 that comprise a light valve arrangement similar to the system shown in FIG. 2. Alternatively, any suitable light valve system that can create the required addressable channels 40 within imaging head 26 may be used. Such systems include, without limitation, cantilever or hinged mirror type light valves such as the Digital Micromirror Device (MD) developed by Texas Instruments of Dallas, Tex.; and grating light valves such as the "Grating Light Valve" developed by Silicon Light Machines of Sunnyvale, Calif. In the alternative, the multi-channel imaging head may include imaging channels that comprise individually-controllable light sources (such as laser sources that emit visible light, infrared light, or other light). Laser arrays other than laser diode arrays may also be employed as sources. For example the arrays may be formed using a plurality of fiber coupled laser diodes with the fiber tips held in spaced apart relation to each other, thus forming an array of laser beams. The output of such fibers may likewise be coupled into a light pipe and scrambled to produce a homogeneous illumination line. In another alternative embodiment the fibers comprise a plurality of fiber lasers with outputs arrayed in fixed relation.

Preferred embodiments of the invention employ infrared lasers. Infrared diode laser arrays employing 150: m emitters with total power output of around 50 W at a wavelength of 830 nm, have been successfully used to implement the invention. It will be apparent to practitioners in the art that alternative lasers including visible light lasers are also employable in the present invention and that the choice of laser source employed may or may not be dictated by the properties of the media to be imaged.

While the present invention has been described in relation to display and electronic device fabrication the methods described herein are directly applicable to the imaging of other repeating patterns including those used in biomedical imaging for Lab-on-a-chip (LOC) fabrication. LOC technology is a rapidly growing research topic within the Instrumentation and Healthcare industries. The principle is to produce an automated, micro-scale laboratory to enable sample preparation, fluid handling, analysis and detection steps to be carried out within the confines of a single microchip. LOC chips may have several repeating patterns of non-contiguous features.

It is to be understood that the exemplary embodiments are merely illustrative of the present invention and that many variations of the above-described embodiments can be devised by one skilled in the art without departing from the scope of the invention. It is therefore intended that all such variations be included within the scope of the following claims and their equivalents.

What is claimed is:

1. A method for forming a plurality of non-contiguous features on a receiver element the method comprising:
   operating a multi-channel imaging head during a first scan of the imaging head in which the imaging head is advanced relative to the receiver element along a scan path to transfer first and second non-contiguous features from a donor element to the receiver element by a thermal transfer process wherein the first and second features are spatially separated from one another other at least in a sub-scan direction;
   operating the multi-channel imaging head during a second scan of the imaging head to transfer a third non-contiguous feature from the donor element to the receiver element by the thermal transfer process wherein the third feature is between the first and second features at least in the sub-scan direction and is spatially separated from each of the first and second features at least in the sub-scan direction;
   wherein the first, second and third non-contiguous features are features of a pattern and wherein the non-contiguous features of the pattern are spatially separated from one another at least in the sub-scan direction;
   comprising separately transferring two or more sets of the non-contiguous features of the pattern, each of the sets comprising one or more of the non-contiguous features of the pattern, wherein two or more non-contiguous features in a first set of the two or more sets are interleaved with the non-contiguous features in an additional set of the two or more sets; and
   comprising assigning the features to each of the two or more sets randomly.

2. A method according to claim 1, wherein a minimum spacing between features in each of the two or more sets is greater than a minimum spacing between the features in the pattern.

3. A method according to claim 1, wherein the pattern of non-contiguous features comprises a pattern of color features, the pattern of color features forming a portion of a color filter.

4. A method according to claim 3, wherein the color filter includes a plurality of patterns of color features, each pattern of color features corresponding to a given color, and the method comprises transferring each of the patterns of color features separately.

5. A method for forming a plurality of non-contiguous features on a receiver element, the method comprising:
   operating a multi-channel imaging head during a first scan of the imaging head in which the imaging head is advanced relative to the receiver element along a scan path to transfer first and second non-contiguous features from a donor element to the receiver element by a thermal transfer process wherein the first and second features are spatially separated from one another other at least in a sub-scan direction;

operating the multi-channel imaging head during a second scan of the imaging head to transfer a third non-contiguous feature from the donor element to the receiver element by the thermal transfer process wherein the third feature is between the first and second features at least in the sub-scan direction and is spatially separated from each of the first and second features at least in the sub-scan direction; and wherein each of the non-contiguous features is screened with at least one of a halftone screen and a stochastic screen.

6. A method according to claim 5, wherein the thermal transfer process comprises a laser-induced mass transfer process.

7. A method according to claim 6, wherein the non-contiguous features comprise both a colorant and binder.

8. A method according to claim 5, wherein the plurality of non-contiguous features comprises a pattern of color features, the pattern of color features forming a portion of a color filter.

* * * * *